United States Patent [19]
Abe et al.

[11] Patent Number: 5,986,442
[45] Date of Patent: Nov. 16, 1999

[54] LOAD DRIVE DEVICE HAVING SHORT-CIRCUIT PROTECTION FUNCTION

[75] Inventors: Atsushi Abe; Junichi Nishimura, both of Shioya-gun, Japan

[73] Assignee: Keihin Corporation, Tokyo, Japan

[21] Appl. No.: 09/110,439

[22] Filed: Jul. 6, 1998

[30] Foreign Application Priority Data

Oct. 27, 1997 [JP] Japan .................................. 9-293999

[51] Int. Cl.$^6$ .............................. G05F 1/565; H02H 7/00
[52] U.S. Cl. .............................. 323/283; 363/50; 363/56; 361/18
[58] Field of Search .................................. 363/50, 55, 56, 363/57; 323/275, 276, 277; 361/18, 86, 88

[56] References Cited

U.S. PATENT DOCUMENTS 4,979,066 12/1990 Kawata et al. ....................... 323/276 X
5,297,014 3/1994 Saito et al. ............................ 363/57 X

*Primary Examiner*—Y. J. Han
*Attorney, Agent, or Firm*—Nikaido, Marmelstein, Murray & Oram, LLP

[57] ABSTRACT

A load device having a short-circuit protection function is disclosed which is capable of avoiding damage of a switching element such as an output transistor. The load device includes a switching element coupled to a load in series. The switching element operates in response to a drive signal. A power supply supplies a voltage across the series circuit of the load and the switching element. A voltage detection circuit detects a voltage exertion to the load and generates a voltage exertion signal. A short-circuit protection circuit interrupts supply of the drive signal to the switching element when no voltage exertion detection signal appears at the expiration of a predetermined period of time from initiation of the supply of the drive signal.

7 Claims, 3 Drawing Sheets

5,986,442

LOAD DRIVE DEVICE HAVING SHORT-CIRCUIT PROTECTION FUNCTION

BACKGROUND OF THE INVENTION

1. Field of the Invention

The present invention relates to a load drive device having a short-circuit protection function.

2. Descriptions of the Related Arts

When, in general, a drive signal is generated from a control circuit in a load drive device which drives an electric load such as a solenoid coil, an output transistor is turned on in response to the drive signal, and a power source voltage is applied to the load via the output transistor, that is, for example, via the emitter and collector path of the output transistor. The application of the voltage to the load is detected by a voltage detection circuit, and a detection result is supplied to the control circuit. For example, in the event that the load is directly short-circuited or a harness to the load is short-circuited, the power source voltage will be directly applied to the output transistor in the turning-on state, so that an over-current exceeding a rated maximum current will flow through the emitter and collector path of the output transistor. At this time, since no detection result for the application voltage to the load can be obtained, the control circuit stops the generation of the drive signal as an indication of occurrence of an accident, when no detection result for the application voltage to the load can be obtained by the voltage detection circuit during producing the drive signal. Thus, it can be prevented that the over-current flows continuously through the output transistor.

SUMMARY OF THE INVENTION

In conventional load drive devices, for example, microcomputers are generally used as a control circuit for use in controlling an engine, and the microcomputer sequentially and repeatedly executes a plurality of processings including an engine control processing. As one of such processings, there is a short-circuit protection processing for stopping the generation of the drive signal in response to the detection result of the application voltage to the load by the voltage detection circuit as described above. Even though, consequently, a situation where no detection result of the application voltage to the load can be obtained from the voltage detection circuit has occurred due to the over-current flowing through the output transistor which is caused by the short-circuit of the load, there may occasionally be a time delay of an execution of the short-circuit protection processing after the occurrence of such situation, so that the output transistor is subjected to an excessive load because of this time delay thereby causing breakage of the output transistor.

The object of the present invention is to provide a load drive device having a short-circuit protection function, which is capable of preventing breakage of a switching element such as an output transistor with certainty.

A load drive device having a short-circuit protection function according to the present invention drives an electric load with application of a drive signal and comprises a switching element coupled in series to the load to operate in response to the drive signal; a power source which supplies a voltage to a series circuit of the load and the switching element; a voltage detection circuit which detects a voltage exertion to the load, for generating a voltage exertion detection signal; and a short-circuit protection circuit which prevents the drive signal from being supplied to the switching element in case no voltage exertion detection signal is generated at the expiration of a predetermined period of time from the initiation of supply of the drive signal.

With the above-described arrangements of the load drive device according to the present invention, when no voltage exertion detection signal can be obtained in spite of the expiration of a predetermined period of time from the supply of the drive signal to the switching element, the supply of the drive signal to the switching element is immediately stopped. Therefore, the breakage of the switching element is surely prevented.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

An embodiment of the present invention will be described in detail with reference to the accompanying drawings below.

Figure 1:
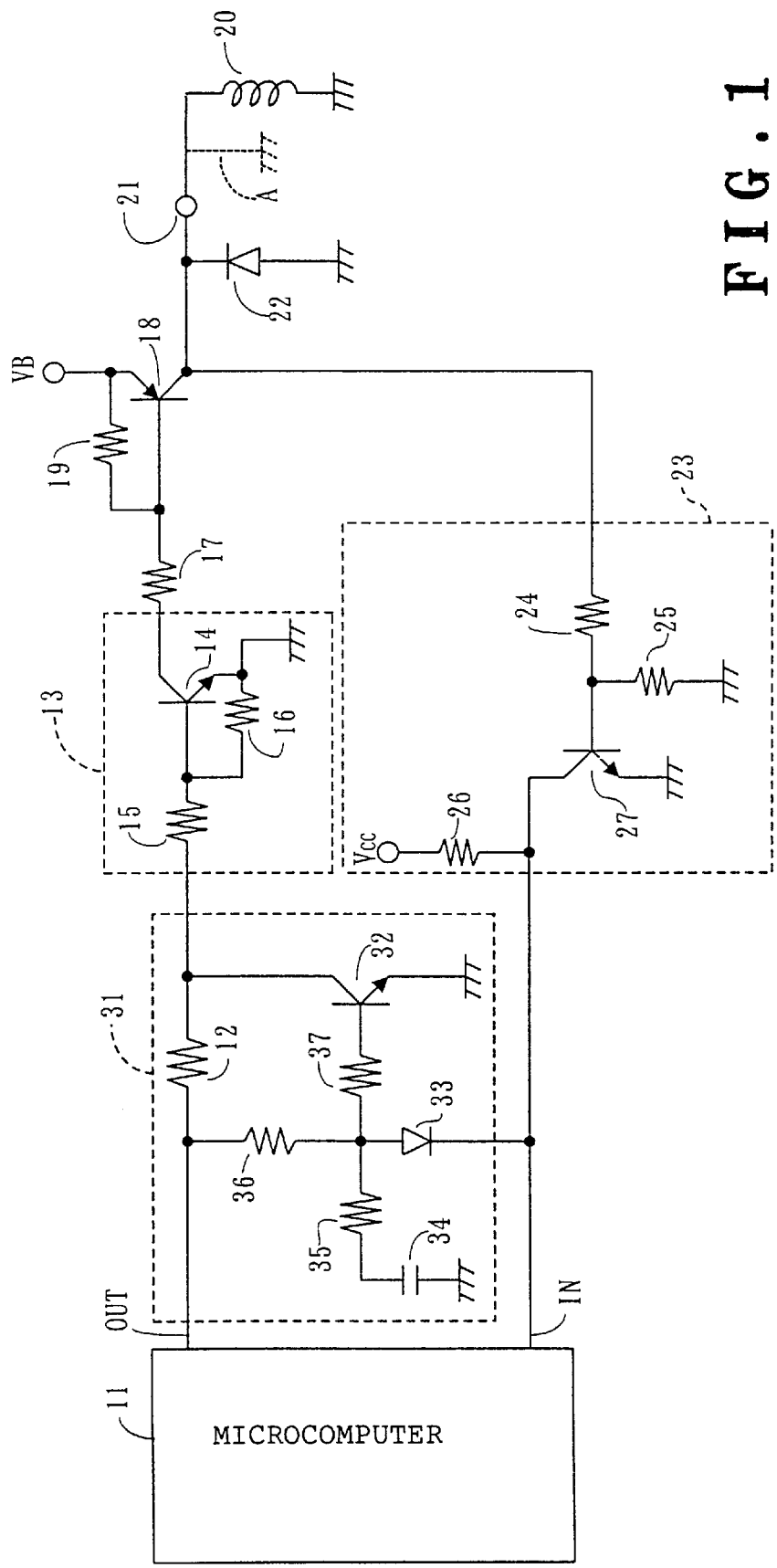
FIG. 1 is a block diagram showing an embodiment of the present invention.

FIG. 1 shows a load drive device having a short-circuit protection function according to the present invention. Referring to the load drive device shown in FIG. 1, the microcomputer 11 is used for controlling an engine, which comprises therein a CPU, memories and a plurality of input/output ports even though they are not shown. It is used for controlling a fuel injection time of an injector and the opening/closing of a secondary air path, for example.

An inverter 13 is coupled to one output port OUT of the microcomputer 11 via the resistor 12. The inverter 13 consists of the NPN transistor 14 and the resistors 15 and 16. The resistor 15 acts as an input resistor of the inverter 13, which is coupled between the resistor 12 and the base of the transistor 14. The resistor 16 is coupled between the base and emitter of the transistor 14. The emitter of the transistor 14 is coupled to the ground and the collector thereof acts as an output terminal of the inverter 13.

An output transistor 18 that is a switching element is coupled to the output terminal of the inverter 13 via the resistor 17. The output transistor 18 is a PNP type transistor, the emitter of which is subjected to the power source voltage VB (for example, 14 V) such as the battery voltage of an automobile. The resistor 19 is coupled between the base and the emitter of the output transistor 18, the base of which is coupled to the foregoing resistor 17. The collector of the output transistor 18 is coupled to an output terminal 21 to which the inductive load 20 such as an solenoid coil is connected. A diode 22 is coupled between the ground and the connection line extending from the collector of the output transistor 18 to the output terminal 21, for blocking a counter electromotive force produced from the inductive load 20.

Moreover, a voltage detection circuit 23 is coupled to a connection line extending to the output terminal 21. The voltage detection circuit 23 includes resistors 24 to 26 and an NPN type transistor 27. The resistors 24 to 26 constitute a voltage dividing circuit, which divides a voltage applied to the inductive load 20. The divided voltage by means of the resistors 24 and 25 is applied to the base of the transistor 27. The emitter of the transistor 27 is coupled to the ground, the collector of which the voltage Vcc is applied thereto via the resistor 26. The collector of the transistor 27 is coupled to the input port IN of the microcomputer 11.

A short-circuit protection circuit 31 is coupled to the connection line extending from the collector of the transistor 27. The short-circuit protection circuit 31 comprises an NPN type transistor 32, the a diode 33, a capacitor 34 and resistors 35 to 37. The foregoing resistor 12 is also included in the short-circuit protection circuit 31. The cathode of the diode 33 is coupled to the connection line extending from the collector of the transistor 27, and the anode thereof is coupled to the ground via a serial connection of resistor 35 and capacitor 34. Furthermore, the anode of the diode 33 is coupled to the connection line between the resistor 12 and the output port OUT of the microcomputer 11 via the resistor 36. In addition, the anode of the diode 33 is coupled to the base of the transistor 32 via a resistor 37. The collector of the transistor 32 is coupled to the connection line between the resistor 12 and the inverter 13, the emitter of the transistor 32 is coupled to the ground.

Figure 2:
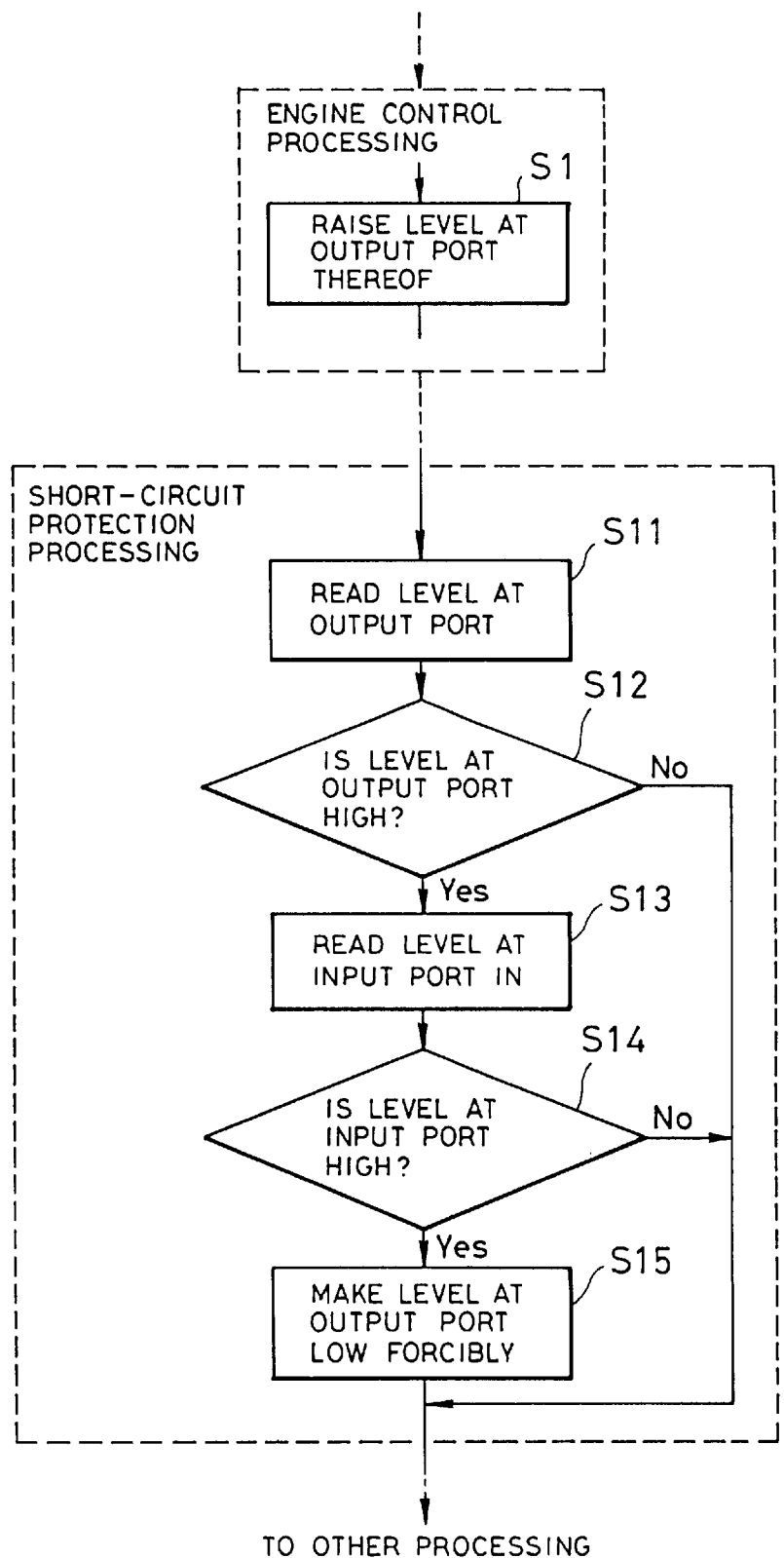
FIG. 2 is a flow chart showing an operation of a micro computer.

The CPU in the microcomputer 11 executes a step S1 among engine control processings as shown in FIG. 2, thereby causing the output port OUT to be a high level indicating the logic "1". This high level is supplied to the inverter 13 via the resistor 12 as a drive signal. Upon receipt of the high level, the transistor 14 of the inverter 13 is turned on, and the level at the collector of the transistor 14, that is, the output level of the inverter 13, changed to a low level indicating the logic "0". The low level output from the inverter 13 lowers the base potential of the output transistor 18, so that the output transistor 18 is turned on. The turning-on of the output transistor 18 allows a current produced by the power source voltage VB to flow into the inductive load 20 from the emitter and collector path of the output transistor 18 via the output terminal 21, and then the power source voltage VB is applied to the inductive load 20. If the inductive load 20 is, for example, a solenoid coil of a secondary air control valve for use in controlling the engine rotational speed at an idle state, which valve is usually provided in a secondary air path communicating with a downstream of a throttle valve of an internal-combustion engine, the application of the power source voltage VB to the inductive load 20 energizes the load 20 to open the secondary air valve, thus supplying the secondary air to the downstream of the throttle valve.

When the power source voltage VB is applied to the inductive load 20, the applied voltage is divided by the resistors 24 and 25, and the divided voltage is supplied to the base of the transistor 27. The transistor 27 is then turned on by the divided voltage, so that the collector of the transistor 27 becomes low in level. This low level potential at the collector of the transistor 27 is supplied to the input port IN of the microcomputer 11.

As shown in FIG. 2, during the short-circuit protection processing after the engine control processing, the CPU of the microcomputer 11 takes or reads the level at the output port OUT (step S11), and determines whether the level at the output port OUT read out is high or not (step S12). When the level at the output port OUT is high, the level at the input port IN is read or taken (step S13). It is determined whether the read level at the input port IN is high or not (step S14). When the read level at the input port IN is high, the level at the output port OUT is forcibly changed to be low (step S15). When the read level at the input port IN is low, the short-circuit protection processing is finished without doing anything.

As long as, accordingly, the potential level supplied to the input port IN of the microcomputer 11 is low, the output port OUT is never forcibly changed to be low in level during the execution of the short-circuit protection processing by the microcomputer 11.

It is in this instance to be noted that the anode voltage V1 of the diode 33 is not so high that it allows the transistor 32 to turn on until the level at the line from the collector of the transistor 27 to the input port IN changes to be low in level. Immediately after the level at the output port OUT is changed to be high in level, the current flows through the resistors 36 and 35, and then flows into the capacitor 34. Hence, the anode voltage V1 gradually increases in dependence on a time constant of a time constant circuit constituted of the capacitor 34 and the resistor 35. The time constant (a predetermined period of time) is set to be slightly longer than a period of time from the inversion of the output port OUT from the low level to the high level until the inversion of the input port IN from the high level to the low level by the turning-on of the transistor 27. When the level at the line coupled to the input port IN is changed to be low, the diode 33 is turned on, and it acts as discharging means. Specifically, energy stored in the capacitor 34 is immediately discharged as a current flowing through the resistor 35, the diode 33 and the transistor 27, so that the anode voltage V1 never increase to such a voltage as to turn on the transistor 32.

When, on the other hand, the inductive load 20 is short-circuited as shown by the broken line A of FIG. 1, and the output transistor 18 is turned on by the high level output port OUT, the voltage VB is exerted across the emitter and collector of the output transistor 18, so that an over-current flows therethrough. In other words, the level at the collector of the output transistor 18 turns into the ground voltage which is equal to a low level. Since, therefore the base potential of the transistor 27 does not increase so highly as to turn on the transistor 27, the transistor 27 keeps its off state. Because of the off state of the transistor 27 makes the level of the collector of the transistor 27 equal to the voltage Vcc indicating a high level, whereby a high level voltage is supplied to the input port IN of the microcomputer 11.

The microcomputer 11 does not read the high level of the input port IN until the microcomputer 11 executes the above-mentioned short-circuit protection processing, although the input port IN is kept to be high in level.

On the other hand, the high level of the collector of the transistor 27 increases the anode voltage V1 of the diode 33. Even if the collector of the transistor 27 is kept at the high level at the time when the change-up time period determined by the capacitor 34 and the resistor 35 has laspsed from the inversion of the output port OUT from the low level to the high level, the anode voltage V1 of the diode 33 is more than a predetermined level, so that the transistor 32 is turned on. Because the turning-on of the transistor 32 makes the input terminal of the inverter 13 low in level, the transistor 14 is turned off, and subsequently the output transistor 18 is also turned off. Therefore, no over-current flow between the emitter and collector of the output transistor 18, so that the transistor 18 is protected from being damaged.

After the transistor 18 is protected from being subject to an over-current because of such an operation of the short-circuit protection circuit 31, the microcomputer 11 executes the short-circuit protection processing, thereby making the output port OUT forcibly low in level.

Figure 3:
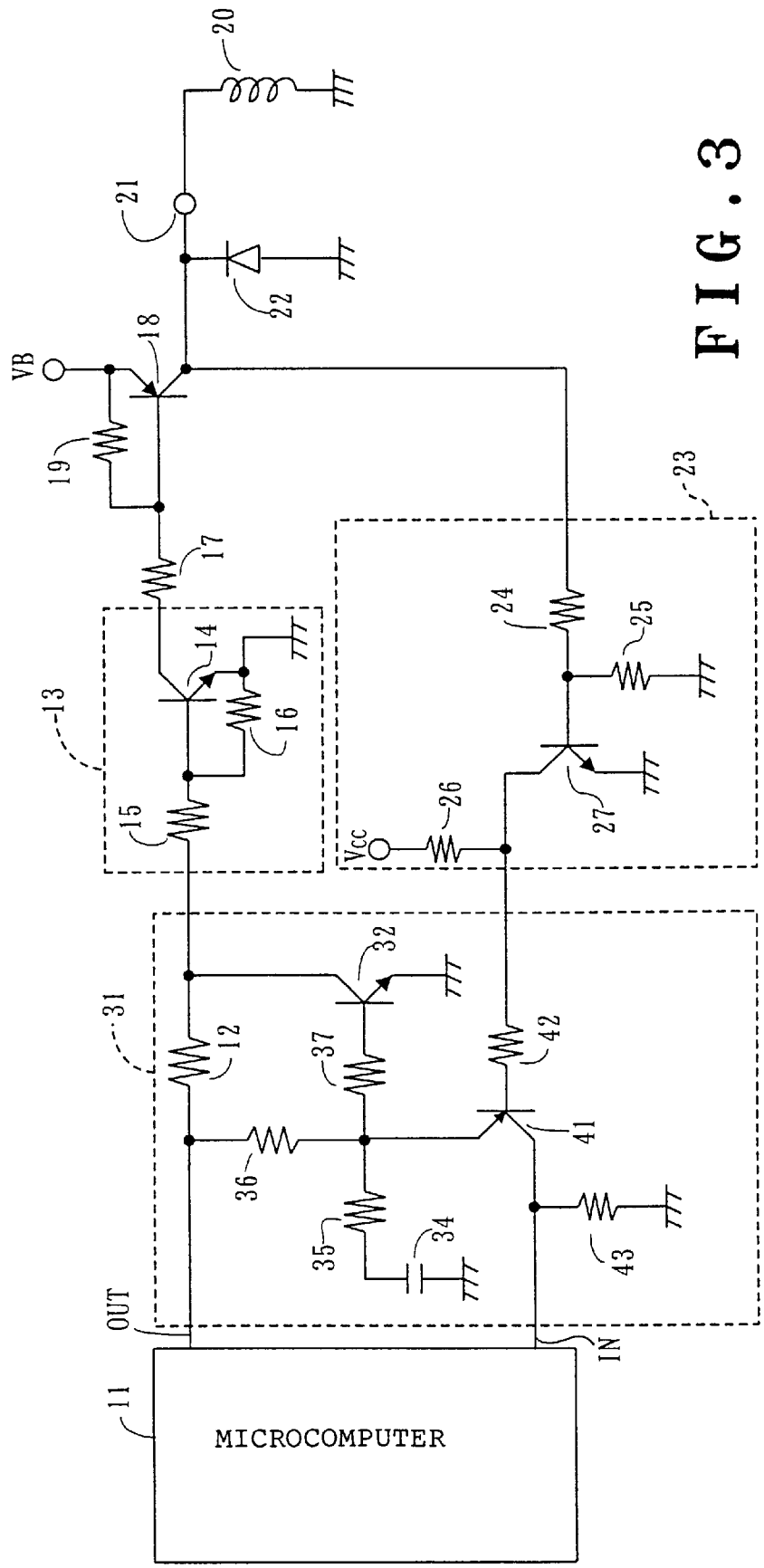
FIG. 3 is a block diagram showing another embodiment of the present invention.

FIG. 3 shows another embodiment of the present invention. In this embodiment, the PNP transistor 41 and the resistors 42 and 43 are employed instead of the diode 33 of FIG. 1. When the transistor 27 is turned off, the transistor 41 is turned off. When the transistor 27 is turned on, the transistor 41 is turned on.

The structures of the short-circuit protection circuits 31 are not limited to those of the foregoing embodiments. The structure may be satisfactory, in which the input of the inverter 13 is made low in level when the input port IN is kept at a high level even though a predetermined period of time has lapsed from the changing in level of the output port OUT from the low level to the high level. This predetermined period of time may be slightly longer than that from the timing when the level of the output port OUT changes from low to high until the timing when the level of the input port IN changes from high to low, as long as the load is not short-circuited.

It should be noted that the logic in each portion of the load drive circuits of FIGS. 1 and 3 in the foregoing embodiments may be opposite. Specifically, when the level of the output port OUT is low, the low level voltage may be a drive signal, and when the power source is applied to the load 20, the level of the input port IN may be high.

Moreover, the present invention is particularly advantageous for a device using a microcomputer of a low processing speed especially one which executes no short-circuit protection processing as an interruption processing.

As described above, according to the present invention, even when the predetermined period of time has lapsed after supplying the drive signal to the switching element, the supply of the driving signal to the switching element is immediately prevented in case of acquisition of no voltage detection signal indicating the voltage application from the voltage detection circuit to the load. Therefore, no overcurrent flows through the switching element for a long period of time, so that damage of the switching element can be surely prevented.

Although the preferred embodiments of the present invention have been described in detail, it should be understood that various changes, substitutions and alterntions can be made therein without departing from spirit and scope of the inventions as defined by the appended claims.

What is claimed is:

1. A load drive device having a short-circuit protection function which drives an electric load in response to a drive signal, comprising:

a switching element coupled in series to said load and operating in response to said drive signal;

a power source which supplies a voltage to a series circuit of said load and said switching element;

a voltage detection circuit which detects a voltage exertion on to said load so as to generate a voltage exertion detection signal; and a short-circuit protection circuit which interrupts a supply of said drive signal to said switching element in case no voltage exertion detection signal is generated at the expiration of a predetermined period of time from an initiation of the supply of said drive signal, wherein said short-circuit protection circuit comprises a time constant circuit including a capacitor to be charged by a voltage level of said drive signal; a transistor turned on when a charged voltage level of said capacitor exceeds a predetermined level, thereby interrupting supply of said drive signal to said switching element; and discharging means for discharging a storage energy of said capacitor when said voltage exertion detection signal appears.

2. A load drive device having a short-circuit protection function which drives an electric load in response to a drive signal, comprising:

a switching element coupled in series to said load and operating in response to said drive signal;

a power source which supplies a voltage to a series circuit of said load and said switching element;

a voltage detection circuit which detects a voltage exertion on to said load so as to generate a voltage exertion detection signal; and a short-circuit protection circuit which interrupts a supply of said drive signal to said switching element in case no voltage detection signal is generated at the expiration of a predetermined period of time from an initiation of the supply of said drive signal; and control means for issuing said drive signal through a specified output port thereof upon the completion of execution of a first program stored therein;

said control means executes a second program for forcibly interrupting the issuance of said drive signal through said specified output port, when said voltage exertion detection signal is not generated at the time of issuance of said drive signal upon completion of the execution of said first program; and said short-circuit protection circuit is so adapted to interrupt supply of said drive signal to said switching element before said control means executes said second program.

3. A load drive device having a short-circuit protection function, which drives an electric load in response to a drive signal, comprising:

a switching element coupled in series to said load and operating in response to said drive signal;

a power source which supplies a voltage to a series circuit of said load and said switching element;

a voltage detection circuit which detects a voltage exertion on to said load so as to generate a voltage exertion detection signal; and a short-circuit protection circuit which interrupts and continues to interrupt a supply of said drive signal to said switching element during a time period while said drive signal is generated when no voltage exertion detection signal is generated at the expiration of a predetermined period of time from an initiation of the supply of said drive signal.

4. The load drive device of claim 3, wherein said short-circuit protection circuit interrupts the supply of said drive signal by inverting the polarity of a signal input to an input of said switching element.

5. The load drive device of claim 3, wherein said short-circuit protection circuit interrupts a supply of said drive signal to said switching element by connecting a signal line upon which said drive signal is fed to said switching element to ground.

6. The load drive device of claim 3, further comprising a microcomputer having an output of said drive signal, wherein said short-circuit protection circuit interrupts and continues to interrupt the supply of said drive signal to said switching element during a time period while said drive signal is generated by said microcomputer.

7. The load drive device of claim 6, wherein said microcomputer has an input from said voltage detection circuit, and when said drive signal is generated, said microcomputer ceases to generate said drive signal when said microcomputer detects no voltage detection signal as an input from said voltage detection circuit.

* * * * *